United States Patent [19]

Weller, Jr. et al.

[11] Patent Number: 4,748,102

[45] Date of Patent: May 31, 1988

[54] PHOTOIMAGING PROCESS USING WATER REMOVABLE COATINGS

[76] Inventors: Edward L. Weller, Jr., 1959 Robincrest La., Glenview, Ill. 60025; Edward Renkor, 2N 565 Pearl Ave., Glen Ellyn, Ill. 60137; Edward L. Weller, III, 1959 Robincrest La., Glenview, Ill. 60025

[21] Appl. No.: 867,956

[22] Filed: May 29, 1986

[51] Int. Cl.$^4$ .......................... G03C 5/24; G03C 5/00
[52] U.S. Cl. .................................... 430/258; 430/260; 430/292; 430/293; 430/294; 430/327; 430/328; 430/935; 430/961
[58] Field of Search ............... 430/292, 294, 293, 327, 430/328, 935, 961, 258, 260

[56] References Cited

U.S. PATENT DOCUMENTS

| | | | |
|---|---|---|---|
| 3,258,337 | 6/1966 | Cousins | 430/293 |
| 4,258,125 | 3/1981 | Edhlund | 430/293 |
| 4,268,601 | 5/1981 | Namiki et al. | 430/294 |
| 4,307,172 | 12/1981 | Ishihara et al. | 430/294 |
| 4,335,197 | 6/1982 | Chambers et al. | 430/294 |
| 4,366,223 | 12/1982 | Larson | 430/293 |

Primary Examiner—Jack P. Brammer
Attorney, Agent, or Firm—Newton, Hopkins & Ormsby

[57] ABSTRACT

Photographic images may be produced on a backing such as paper and polyester sheets, from photographic negatives which encompass line rendering, design comps, copy, complex color separation or the like with water-based varnishes and pigments, the resulting images closely resembling, if not exactly, the same image in its commercially printed form. Thus all aspects of color proofs produced by this invention provide greatly improved predictability as to the appearance of the final printed job, with a further improvement of cost savings over conventional techniques of preparing color proofs. Also, said proofing method can be used to provide a "transfer" so that one may transfer the colored image or images to a more suitable or required backing.

10 Claims, No Drawings

PHOTOIMAGING PROCESS USING WATER REMOVABLE COATINGS

BACKGROUND OF THE INVENTION

1. Field of the Invention

This invention relates to a method of producing colored images on various substrates. By first coating the substrate with a sealer and when dried, coating with a water based pigmented photo-sensitive coating; after drying, exposing this coating to ultraviolet light through a photographic negative, and developing this image by removing the unexposed portion with water. These colored images using this process are particularly useful in preparing direct images, transfer or rub off images, and can also be used in preparing pre-press proofs that more closely resemble actual press proofs or press runs than similar proofs from the techniques of the prior art.

2. Description of the Prior Art

The color printing industry is, of course, massively large, with billions of dollars going toward the creation of beautiful color reproductions of photographs for magazines, art work, sales brochures, and the like.

As a color print job is laid out, it is often necessary to prepare a color proof or composition for careful examination prior to going forward with the substantial expense of setting up the press for commercial printing of the color reproduction. The original art work might consist of a single negative or multi negatives for complex color work, or it might consist of accurate four color separations to reproduce process color images.

A disadvantage of the prior art process is that most direct imaging and transfer systems use solvent based ink solutions which contain flammable or hazardous materials. In addition, a clear solvent solution or solutions which are also flammable or hazardous must be used for these images to be developed after exposure to ultraviolet light.

When using the method which uses a solvent based ink, another disadvantage is that the system will not hold fine line detail which is necessary in many cases of reproductions of art work and mandatory when required to make a detailed four color process image.

In Lupo, U.S. Pat. No. 2,716,061, a pigmented contact printing emulsion is disclosed for use in reproducing multi-colored photographic images on flexible supports, and especially vinyl plastic sheets. While having some similarity to the invention of this application, the formulations disclosed in the Lupo patent exhibit significant disadvantages, and are not practically capable for commercial use in the preparation of direct imaging, transfer lettering or, pre-press proofs.

Substantial disadvantages are found in the commercially available formulation of the Lupo patent compared with the preferred formulations of this invention. First, the formulation of the Lupo patent is less viscous and when a substrate is coated by placing it in a conventional whirler it dries unevenly and leaves mottled areas having different color densities. Furthermore, the exposed coating of the prior art patent tends to wash away more easily than the exposed coating in accordance with this invention after a comparable amount of exposure to ultraviolet light.

The photosensitive emulsion or varnish of this invention requires less ultraviolet light exposure time to cure. Furthermore, the exposed photosensitive coating of this invention may be washed with pure water to remove the noncross-linked portions, rather than requiring an ammonium hydroxide solution for washing as in the prior art.

The prior art formulations are applied, in their commercially available forms, by hand application to a backing by the whirler process. It is then dried by conventional methods after which a photographic negative is laid over the coating which is on a substrate and is exposed to ultraviolet light. After the desired exposure period, the negative is then removed and the portions of the coating underneath the transparent parts of the negative are rendered insoluble. When the negative is removed, the substrate with a particular color which has just been exposed is washed with a dilute ammonia solution to remove the portions of the applied coating which were not rendered insoluble by exposure to ultraviolet light.

Prior art processes used commercially in producing pre-press proofs consist of expensive mechanical equipment and involve the use of micropulverized pigmented material which is applied to a sensitized flexible film by hand or some mechanical means. Then the proper negative is placed over the flexible film which has the color applied and is exposed to ultraviolet light. After exposure the negative is removed and the applied color on the sensitized flexible film is developed. Successive sensitized films are used, each having its specific color. When the required number of flexible films are developed they are laminated after they are placed in register, however, the laminations cause a gloss and depth of image which is not achieved when the job is actually printed.

SUMMARY OF THE INVENTION

The method of this invention comprises the steps of mechanically applying a sealer coat onto a flexible or rigid backing (including metal, glass, paper, polyester, etc.) surface using a rod. The sealer coat is dried, and then a uniform layer of a water-based mixture is applied by means of a wire wound rod over the sealer coat, the mixture containing a selected pigmented color dispersion and sufficient water solubilized organic resins to form a film on drying. The mixture also contains either an alkali dichromate salt or aromatic diazo compound commonly used in the printing art. The organic resins are selected from the group consisting of polyvinyl alcohol, polyvinyl acetate, acrylic polymers, silicone acrylics, acrylated urethanes, and proteinbased hydrolysates such as casein. The alkali dichromate salt is selected from the group consisting of a sodium dichromate, potassium dichromate, and ammonium dichromate.

A selected photographic negative image is pressed against the dried uniform pigmented layer and exposed to ultraviolet radiation for cross-linking the applied coating and the dichromate salt. Following exposure, the negative is removed and the cured film is washed with potable water to remove the noncross-linked portions thereof. The backing and exposed developed coating is now dried. The image which has been developed is a reproduction of the photograph from which the negative was made. When the seal coat and then the pigmented organic resin mixture is applied to a flexible film backing on which a silicone release type of coating has been deposited and a photographic negative is exposed and the coating exposed and dried in the same manner as mentioned above, one has produced the colored image of a potential transfer. In order to cleanly transfer this image the seal coat should be removed. Then a thin layer of adhesive is applied to the entire sheet over the exposed cured image and the flexible backing is then placed on the substrate with the image contacting the surface to which one wishes to transfer. By rubbing with a burnishing tool the image will leave the silicone treated surface and adhere to the pre-selected new surface. Transfer imaging has now been accomplished.

Another advantage of this invention is that the photosensitive coating when exposed and developed produces a sharper image with finer lines resulting in a more detailed colored image.

Another advantage of this invention is that several colors can be applied in successive steps using different negatives made from the color separation process.

As each color is deposited, developed, and dried and the next color deposited progressively in this manner as many times as the entire sets of negatives require and using the appropriate color on the negative separations the entire original image, or art picture can be reproduced as a direct image. These steps are all accomplished by applying colored vehicle over the same base coat. This process is known as multi-color direct imaging.

In addition, another unique use of this invention is to color match the primary colored coatings prior to using them so that they are the same density and hue as the Standard Web Offset Printing (SWOP) standard color chips, as circulated to the printing industry as standards; or any other conventionally used color standards. Using the precisely controlled color coating, it is possible to make repeated identical reproductions of the initial process colored photograph and hence the standard for the commercial press run of this product. This state of the art is known as "pre-press proof".

Accordingly, it is an object of the present invention to create a water-based system which can be cast onto various substrates so as to produce a colored image by using a pigmented colored water based photosensitive coating and a photographic negative.

Another object of the present invention is to create a colored image on a substrate, from a single negative. This negative being made from the entire artwork common to the art design industry.

Another object of the present invention is to create a colored image on a selected substrate, from several negatives, each negative being a principal part of a composite photograph that has been recorded on photographic film.

Another object of the present invention is to provide a system which is capable of producing a duplicate of the original color photograph, using the separation negatives of the original and by using the four primary color inks applied and processed in sequence.

Another object of the present invention is to produce a pre-press proof using a water-based system.

Another object of the present invention is to produce a pre-press proof which more closely resembles the image of its commercially printed form, by using pigmented coatings which contain the same selection of pigments as found in the inks used in printing the picture.

Another object of the present invention is to be able to transfer the color image to any type of material, e.g. paper, vinyl, styrene, wood or metal.

Another object of the present invention is to produce a photosensitive coating or varnish having decreased curing time.

Another object of the present invention is to produce a color image having improved sharpness and overall quality.

Another object of the present invention is to produce a reproducible film thickness by using a number eleven (11 mm diameter of wire wound on a suitable rod) rod when coating a substrate.

In addition, using a larger numbered rod than a number eleven rod when a heavier wet film giving a greater density of color is desired, and conversely using a smaller numbered rod when a thinner wet film is desired giving a less dense color.

Another object of this invention is to produce a photosensitive colored liquid mixture which is stable over extended periods of time and only under adverse conditions is a bactericide added in order to prevent bacteriological degradation.

Other objects, features, and advantages of the present invention will become apparent from the following description.

DESCRIPTION OF THE PREFERRED EMBODIMENTS

Referring now in detail to the steps of the method of the present invention, one mechanically applies onto a flexible backing a uniform layer of a pigment free sealer coat. The flexible backing may be a silicone treated styrene-based stock or any other suitable material of appropriate size, including acrylic, mylar, vinyl, acetate or metallic substrates such as aluminum foil or on coated, or semi-coated paper stocks.

The sealer coat of this invention comprises the following ingredients, with the amount of each ingredient being expressed in percent by weight:

| | |
|---|---|
| ethyl acetate | 51.0 percent |
| nitrocellulose solution | 44.0 percent |
| dioctyl phthalate | 4.8 percent |
| citric acid | 0.2 percent |
| | 100.0% |

The nitrocellulose solution comprises the following ingredients, also being expressed in percent by weight:

| | |
|---|---|
| 18-25 cps. RS nitrocellulose | 40.0 percent |
| isopropyl alcohol | 17.0 percent |
| isopropyl acetate | 23.0 percent |
| n-propyl acetate | 20.0 percent |
| | 100.0% |

The sealer coat is squirted onto the backing in a straight line along the top edge. A coating rod is placed above the applied liquid coating and drawn towards the bottom edge of the backing material in a smooth, even motion. The coating is dried with a conventional forced warm air dryer or other suitable means until completely dry to the touch.

The selected water-based color pigments are then mechanically applied to the backing. In some instances it may be desirable to apply a coating of opaque white ink prior to application of the desired pigments to provide a background which contrasts with the image. The pigments are dispersed in a water-based varnish comprising a sufficiently dispersed organic resin to form a film on drying and an alkali dichromate salt, preferably ammonium dichromate but also possibly including sodium dichromate, potassium dichromate, or a dichromate salt of an amine or quaternary ammonium radical. Alternatively, a diazo compound may be substituted for the alkali dichromate salt.

Broadly, it is contemplated to use any organic resin which is susceptible to a cross-linking reaction with an alkali dichromate salt under ultraviolet light exposure. Typical examples of organic resins which may be used are artificial resins such as polyvinyl alcohol, polyvinyl acetate, acrylic polymers, silicone acrylics, acrylated urethanes, and protein based resins such as casein. The dissolved resin is preferably present in the varnish and dispersion mixture 25 to 75 times greater quantity by percent weight than the dissolved dry dichromate salt, which constitutes a substantial reduction in the amount of dichromate salt present when compared with the prior art. As the result of this, the pigment-free varnish layer exhibits less color tint (caused by the dichromate salt) than that of the prior art, which helps in obtaining the pure color value desired when pigment is added to the varnish.

The uniform layer of water-based varnish containing the color pigments may be applied onto the backing by the use of a conventional wire-wound rod, preferably with a winding wire having a diameter of about 5 to about 18 mils. Wirewound rods are commercially available expressly for the purpose of placing uniform liquid coatings on a backing.

The uniform layer is then dried, for example, with a forced warm air dryer of conventional design or any other suitable means. The drying step is accelerated by using a hot air blower. Following the drying step, the uniform colored layer on the backing is pressed against a selected transparent negative image such as a photographic screened or lined negative or a half-tone negative. The two members are held together preferably by vacuum suction or other mechanical means for intimate, facing contact. Any pigment area not covered by the film negative should be masked. Thereafter, the negative is exposed to actinic radiation, particularly ultraviolet radiation, which passes through transparent areas of the negative image causing cross-linking of the organic resin, typically polyvinyl alcohol, polyvinyl acetate, acrylic polymers, silicone acrylics, acrylated urethanes, and casein and the like, and an alkali dichromate salt. A one to three minute application of ultraviolet light has proven to be quite adequate when emitted from a 2 kilowatt metal halide ultraviolet source such as is conventionally used in plate making.

Following the ultraviolet light radiation step, the backing and cured emulsion layer is separated from the negative, unexposed ink is removed by gently rubbing the surface of the backing with a water saturated paper towel and then washing with water to remove the non-cross-linked portions of the emulsion. Unlike the preferred formulations, the water does not have to be buffered on the alkaline side with ammonia or the like, but simple tap water or deionized water may be used for a substantial savings in cost.

When a transfer is desired, the above described process is applied to a silicone coated backing sheet and, after the last pigmented coating is developed with water, the surface is dried. The seal coat is removed by wetting a soft foam strip with acetone and drawing the strip over the cured emulsion applying moderate pressure for the entire distance and then drying the image area with a warm air dryer. The entire surface of the backing sheet is coated with adhesive using the same technique and rod as used for applying th seal coat. After the adhesive has dried, the image is ready to be transferred onto any desirable substrate. Satisfactory results are obtained using a 30% solution of A 673 adhesive diluted with acetone. This material is available from Advance Process Supply Company, Chicago, Ill.

The water-based varnish of this invention is generally maintained within a pH range of from about 7.0 to about 9.0 by using selected pH controlling agents. It is particularly preferred to use a mixture of ammonium hydroxide and an organic amine having a boiling point of at least 100° C. The organic amine should be present in an amount capable of imparting a pH of 7.0 to the varnish in the absence of the ammonium hydroxide. By way of example, organic amines which may be used in this invention include: 2-dimethylamino-2-methyl-1-propanol (which contains 20% added water as DMAMP80); 2-amino-2-methyl-1-propanol (which contains 5% added water as AMP-95); or the group of amines represented by diethylamino ethanol.

When the water-based pigmented emulsion or varnish mixture is placed on the backing and dried, the ammonium hydroxide is removed by evaporation. However, because the organic amine is sufficiently less volatile than water, it remains to impart latent akaline conditions to the film and to facilitate the process of developing after ultraviolet exposure. During the washing step, some of the organic amine may remain to facilitate dissolving of the resin. Furthermore, as stated above, the rate of cure under ultraviolet radiation and the separation of the soluble portions of the resin layer from the insoluble portions is greatly facilitated in the invention of this application.

It is generally preferable for the emulsion and pigmented varnish of this invention to include from 5 to 20 percent by weight of resin and from 0.1 to 1.0 percent by weight of ammonium dichromate. It is also generally preferable for the weight of dissolved dry resin present to be from 25 to 75 times greater in quantity than the weight of the dissolved dry ammonium dichromate therein.

It is also preferable for the pigmented emulsion or varnish mixture of this invention to have a viscosity range, as measured by a commercially available No. 2 Zahn cup, of 30 to 60 seconds at 72° F and more particularly of about 40 to 55 seconds at 72° F.

The acrylic polymer of this invention may be mixed as desired with dry pigment or pigment press cake to provide a formulation of 8 to 20 percent by weight of any desired dry pigment (and typically 10 percent by weight), 1 to 5 percent by weight of a defoaming agent (typically a volatile organic solvent such as isopropanol) to prevent foaming during the process of milling in the dry pigment, with the balance of the material comprising the base varnish described above. Alternatively, the dry pigments can be mixed with the defoaming agent and water prior to adding to the varnish. This mixture can be milled in a steel ball mill or porcelain lined pebble mill or any other suitable dispersing equipment, until completely uniform to provide an aqueous pigment dispersion ready for mixing with the base varnish in desired proportions to accurately match the desired color for use in the preparation of color imaging.

The addition of a small amount of coalescing agent is also desirable, for example from 0.5 to 2 percent by weight, and typically about 0.5 percent by weight of a polyether solvent such as Cellosolve or Carbitol. This helps to impart desirable synergistic properties to the pigment dispersion producing a homogeneous state with the emulsion or varnish mixture.

One specific embodiment of the clear varnish of this invention comprises the following ingredients, present in water dispersion, with the amount of each ingredient being expressed in percent by weight:

| | |
|---|---|
| organic resin or casein | 10.0 percent |
| ammonium hydroxide (concentrated) | 0.2 percent |
| amine | 0.1 percent |
| coalescing agent such as Cellosolve or Carbitol | 0.5 percent |
| water | 89.2 percent |
| | 100.0% |

This clear varnish material may then be mixed with a pigment dispersion in the acrylic polymer to provide differing colors and color intensities as desired, and to serve as the coating for color imaging according to the process described above, or for other photoreproduction techniques as may be desired.

By way of example, various aqueous pigment dispersions may be prepared by mixing together the ingredients as set forth in Table I.

TABLE I
Aqueous Pigment Dispersions

| Pigment | Ingredient | Percent by Weight |
|---|---|---|
| DIARYLIDE YELLOW | AAA diarylide yellow presscake[1] (50% solids) | 20.0 |
| | Joncryl 74F[2] | 60.0 |
| | Water | 15.0 |
| | Isopropyl Alcohol (anydrous) | 5.0 |
| | | 100.0 |
| RUBINE RED | Lithol Rubine pigment[3] | 10.0 |
| | Joncryl 74F | 70.0 |
| | Water | 20.0 |
| | | 100.0 |
| PHTHALO BLUE | Phthalo blue presscake[4] (40% solids) | 45.0 |
| | Joncryl 74F | 55.0 |
| | | 100.0 |
| CARBON BLACK | Regal 99R carbon black pigment[5] | 10.0 |
| | Joncryl 74F | 70.0 |
| | Carbitol | 0.5 |
| | Water | 19.5 |
| | | 100.0 |

[1]Available from Hilton Davis, Cincinnati, Ohio as C-68-C-102
[2]Styrenated acrylic copolymer 48% solids, available from S. C. Johnson, Racine, Wisconsin
[3]Available from Hilton Davis as 10-6C-65F334
[4]Available from Hilton Davis as 10-6C-65-F315, Peacoline Blue
[5]Available from Cabot Corp.

The red, blue and black aqueous dispersion mixtures were ground in steel ball mills for 24 hours. The yellow aqueous dispersion mixture was ground in a porcelain jar mill for 24 hours. This method produces uniform dispersions by reducing the pigment agglomerates to very fine particles, thus yielding optimum gloss, transparency and coating capability.

The photosensitive inks were prepared by mixing the ingredients as indicated in Table II.

TABLE II
Aqueous Photosensitive Inks

| Color | Ingredients | Percent by Weight | Viscosity (Sec. #2 Zahn) (@ 72° F.) |
|---|---|---|---|
| YELLOW | Diarylide Yellow Dispersion[1] | 15.0 | 55 |
| | Resin Solution[2] | 55.0 | |
| | Water | 30.0 | |
| | | 100.0 | |
| RED | Rubine Red Dispersion[1] | 15.0 | 53 |
| | Resin Solution[2] | 55.0 | |
| | Water | 30.0 | |
| | | 100.0 | |
| BLUE | Phthalo Blue Dispersion[1] | 13.0 | 55 |
| | Resin Solution[2] | 55.0 | |
| | Water | 32.0 | |
| | | 100.0 | |
| BLACK | Carbon Black Dispersion[1] | 15.0 | 52 |
| | Resin Solution[2] | 55.0 | |
| | Water | 30.0 | |
| | | 100.0 | |
| FLUORESCENT ORANGE | Fluorsescent Orange Pigment[3] | 16.7 | 50 |
| | Resin Solution[2] | 48.0 | |
| | Joncryl 74F | 8.3 | |
| | Water | 27.0 | |
| | | 100.00 | |

[1]See Table I
[2]See page 12 lines through 14 for resin solution
[3]Available from Magruder Co. Sunset Orange, 319, JS-503019

Typically, to each 100 gm ink solution (See Table II) 0.1 to 5.0 gm of a 20% by weight solution of ammonium dichromate is added, which has been adjusted previously to a pH of 8.5 with concentrated ammonium hydroxide, commonly known in the industry as 28 Baumé. The ammonium dichromate functions as a photosensitizer which reacts with the resin solids in the finished dry ink film when exposed to ultraviolet light to form water insoluble cross-linkages at the point of exposure.

The above examples have been offerred for illustrative purposes only, and are not intended to limit the invention of this application, which is as defined in the claims below.

What is claimed is:

1. A method of photographically producing a colored image on a backing using a water-basd system, which comprises:
applying a sealant coat containing a nitrocellulose solution onto said backing with a coating rod;
drying said sealer coat;
applying a uniform layer of a water-based varnish with a coating rod onto said backing over the sealer coat, said water-based varish consisting essentially of a color pigment dispersion, sufficient dispersed organic resin in the range of from about 5 to about 20 percent by weight, said resin being capable of forming cross-links in the presence of ultraviolet radiation and selected from the group consisting of casein, polyvinyl alcohol, polyvinyl acetate, acrylic polymers, silicone acrylics and urethanes, and an alkali dichromate salt in the range of about 0.1 to abooout 1.0 percent by weight, said resin being present in said varnish 25 to 75 times greater by weight than said dry dichromate salt;
drying said uniform layer;
pressing said uniform layer against a transparent negative image of the desired image;

exposing said uniform layer to actinic radiation which passes through transparent areas of said negative image to cause cross-linking said organic resin and dichromate salt, rendering these areas insoluble;

developing said image by washing said uniform layer with water to remove noncross-linked portions thereof; and drying said developed image on said backing.

2. The method of claim 1 further comprising the step of removing the sealer coat with acetone after the final drying step, applying a uniform layer of adhesive over the dried colored layer, and transferring the image to other substrates.

3. The method of claim 1 further comprising the steps of coatng the backing with successive layers of colored pigment and progressively developing the image using appropriate transparent negatives until a multi-colored image is produced.

4. The method of claim 1 in which said organic resin is a mixture of polyvinyl alcohol and an acrylic polymer solution.

5. The method of claim 1 in which the pH of said water-based varnish is from about 7.0 to about 9.0.

6. The method of claim 5 in which said water-based varnish contains a mixture of ammonium hydroxide and an organic amine having a boiling point of at least 100° C and present in an amount capable of imparting a slightly alkaline pH to said varnish in the absence of said ammonium hydroxide.

7. The method of claim 6 in which said amine is selected from the group consisting of 2-dimethylamino-2-methyl-1-propanol; 2-amino-2-methyl-1-propanol; or the group of amines represented by diethylamino ethanol.

8. The method of claim 1 in which said varnish has a viscosity range by a No. 2 Zahn cup of 30 to 60 seconds at 72° F.

9. The method of claim 1 in which said varnish contains the following ingredients in substantially the proportions specified, in percent by weight:

| | |
|---|---|
| polyvinyl alcohol resin | 10.0 percent |
| water | 89.2 percent |
| ammonium hydroxide (concentrated) | 0.2 percent |
| amine | 0.1 percent |
| pigment dispersing agent | 0.5 percent |
| | 100.0% |

10. The method of claim 1 in which said transparent negative image is a photographic half-tone, line, screen, or complex set of separated negatives.

* * * * *